US007923752B2

(12) United States Patent
Yamada et al.

(10) Patent No.: US 7,923,752 B2
(45) Date of Patent: Apr. 12, 2011

(54) THIN-FILM CRYSTAL WAFER HAVING PN JUNCTION AND METHOD FOR FABRICATING THE WAFER

(75) Inventors: Hisashi Yamada, Tsukuba (JP); Noboru Fukuhara, Tsukuba (JP); Masahiko Hata, Tsuchiura (JP)

(73) Assignee: Sumitomo Chemical Company, Limited, Osaka (JP)

( * ) Notice: Subject to any disclaimer, the term of this patent is extended or adjusted under 35 U.S.C. 154(b) by 2276 days.

(21) Appl. No.: 10/046,739

(22) Filed: Jan. 17, 2002

(65) Prior Publication Data
US 2002/0145153 A1 Oct. 10, 2002

(30) Foreign Application Priority Data
Jan. 17, 2001 (JP) ................................ 2001-009143

(51) Int. Cl.
*H01L 29/735* (2006.01)
*H01L 29/739* (2006.01)
(52) U.S. Cl. ........ 257/187; 257/190; 257/197; 257/198; 257/E29.033; 257/E29.081; 438/312
(58) Field of Classification Search .................. 257/187, 257/190, 197, 198, E29.033, E29.081; 438/312
See application file for complete search history.

(56) References Cited

U.S. PATENT DOCUMENTS

| 5,351,256 | A | * | 9/1994 | Schneider et al. | ....... 372/45.011 |
| 5,766,981 | A | * | 6/1998 | Thornton et al. | ............... 438/36 |
| 5,811,844 | A | * | 9/1998 | Kuo et al. | ..................... 257/194 |
| 5,844,260 | A | * | 12/1998 | Ohori | ............................. 257/190 |
| 5,844,261 | A | * | 12/1998 | Kuo et al. | ..................... 257/194 |
| 7,122,846 | B2 | * | 10/2006 | Kish et al. | ........................ 257/96 |
| 7,208,770 | B2 | * | 4/2007 | Kish et al. | ........................ 257/96 |
| 2002/0031853 | A1 | * | 3/2002 | Fujimoto | ........................ 438/48 |
| 2002/0118720 | A1 | * | 8/2002 | Ebeling et al. | ................. 372/96 |
| 2003/0064538 | A1 | * | 4/2003 | Fujimoto | ........................ 438/48 |
| 2003/0170927 | A1 | * | 9/2003 | Holonyak et al. | ............... 438/47 |

FOREIGN PATENT DOCUMENTS
JP 8-241896 9/1996
* cited by examiner

*Primary Examiner* — Ngan Ngo
(74) *Attorney, Agent, or Firm* — Birch, Stewart, Kolasch & Birch, LLP

(57) ABSTRACT

A thin-film crystal wafer having a pn junction includes a first crystal layer of p GaAs, a second crystal layer of n $In_xAl_yGa_{1-x-y}P$, the first and second crystal layers being lattice-matched layers that form a heterojunction, and a control layer of a thin-film of $In_xAl_yGa_{1-x-y}P$ differing in composition from the n $In_xAl_yGa_{1-x-y}P$ of the second crystal layer is formed at the interface of the heterojunction. The control layer enables the energy discontinuity at the interface of the $In_xAl_yGa_{1-x-y}P/GaAs$ heterojunction to be set within a relatively broad range of values and thus enables the current amplification factor and the offset voltage to be matched to specification values by varying the energy band gap at the heterojunction.

11 Claims, 3 Drawing Sheets

THIN-FILM CRYSTAL WAFER HAVING PN JUNCTION AND METHOD FOR FABRICATING THE WAFER

BACKGROUND OF THE INVENTION

1. Field of the Invention

This invention relates to a thin-film crystal wafer having a pn junction and a method for fabricating the wafer.

2. Background Art

The heterojunction bipolar transistor (HBT) is a bipolar transistor whose emitter injection efficiency is enhanced by using an emitter layer material with a greater band gap than the base layer material in order to make the emitter-base junction a heterojunction. The HBT is a semiconductor device that is highly suitable for use in the microwave band and higher frequency regions. Owing to advantages such as ability to be driven by a single power source, high efficiency and low distortion, moreover, the HET is expected to be the semiconductor device of choice especially in next generation mobile telephone units.

Among the different types of HBT in actual use, the InGaP-system HBT is a particularly focus of attention owing to its superiority over the AlGaAs-system HBT, which has achieved the highest level of development to date, in features such as availability as high-purity crystal owing to good oxidation resistance, little reverse injection of holes owing to large valence electron band offset relative to GaAs, absence of the DX center (the deep-level electron trap typical of III-V Group compound semiconductors), low recombination speed at the interface, and advantages from the aspect of device processing due to large etching selection ratio.

The InGaP-system HBT is, for instance, produced using a thin-film crystal wafer given a structure wherein the pn junction constituting the emitter-base junction is formed as a heterojunction by using the metal-organic chemical vapor deposition (MOCVD) method to grow in order on a semi-insulating GaAs substrate an n$^+$ GaAs layer, an n GaAs layer (collector layer), a p GaAs layer (base layer), an n InGaP layer (emitter layer), an n$^+$ GaAs layer, and, topmost, an n$^+$ InGaAs layer.

The basic operations of the HBT fabricated using the InGaP thin-film crystal wafer of this configuration are the same as those of the conventional bipolar transistor using silicon. In order to enable the HBT to provide adequate performance matched to specifications required in the microwave band and higher frequency regions, therefore, the HBT must be designed to have current amplification factor β and offset voltage Vbe values suitable for the specifications.

Since the current amplification factor characteristic and the offset voltage characteristic both depend on the energy band gap at the pn junction, the energy discontinuity value of the conduction band has to be changed in order to set these transistor characteristics to the desired values. In the case of an InGaP-system HBT, however, electrical characteristics suitable for the requirements cannot always be realized because the degree of freedom in designing the In$_x$Ga$_{1-x}$P/GaAs system of the HBT is severely limited by the fact that lattice matching between the In$_x$Ga$_{1-x}$P emitter layer and the GaAs base layer can be obtained only at a value of x=0.48.

Unexamined Japanese patent application JP-A-8-241896 teaches a method for overcoming this problem of the InGaP/GaAs-system HBT by selecting the x value of the In component of the In$_x$Ga$_{1-x}$P emitter layer so that the In$_x$Ga$_{1-x}$P lattice constant becomes slightly smaller or slightly larger than the lattice constant of the InGaAs base layer or the GaAs base layer.

When the x value of the In component of the emitter layer is significantly changed in accordance with this technique, however, compressive or tensile stress acting on the emitter layer and the base layer owing to the consequent large mismatch between the lattice constants of the two layers produces defects at the interface. The current amplification factor β decreases as a result. In addition, increased overall wafer warp caused by heavy strain produced throughout the wafer becomes a drawback during fine patterning. It is therefore difficult to achieve a substantial improvement in HBT design freedom with this prior art technology.

SUMMARY OF THE INVENTION

One object of the present invention is therefore to provide a thin-film crystal wafer having a pn junction that overcomes the foregoing problems of the prior art, and a method for fabricating the wafer.

Another object of the present invention is to provide a low-warp thin-film crystal wafer having a pn junction that enables the energy discontinuity of the junction interface at an In$_x$Ga$_{1-x}$P/GaAs heterojunction to be set within a relatively wide range of values, and a method for fabricating the wafer.

Another object of the present invention is to provide a thin-film crystal wafer having a pn junction that offers a high degree of freedom in designing an InGaP/GaAs-system HBT, and a method for fabricating the wafer.

The present invention achieves the foregoing objects by providing a thin-film crystal wafer having a pn junction comprising a first crystal layer of p GaAs, a second crystal layer of n In$_x$Al$_y$Ga$_{1-x-y}$P, the first and second crystal layers being lattice-matched layers that form a heterojunction, and a thin-film layer (control layer) of In$_x$Al$_y$Ga$_{1-x-y}$P differing in composition from the n In$_x$Al$_y$Ga$_{1-x-y}$P of the second crystal layer is formed at an interface of the heterojunction.

In the thin-film crystal wafer having a pn junction of the foregoing structure, the value of the energy band gap at the heterojunction can be controlled by changing the x value of the In component of the In$_x$Al$_y$Ga$_{1-x-y}$P thin film acting as a control layer to make its lattice constant different from the lattice constant of the second crystal layer of n In$_x$Al$_y$Ga$_{1-x-y}$P and the lattice constant of the first crystal layer of p GaAs while maintaining the lattice constants of the second crystal layer of n In$_x$Al$_y$Ga$_{1-x-y}$P and the first crystal layer of p GaAs the same. As the region of lattice constant mismatch produced by the structure is limited solely to the vicinity of the thin film layer, occurrence of defects that seriously affect the transistor characteristics can be effectively inhibited. Moreover, the warp arising in the thin-film crystal wafer having a pn junction as a whole can be kept relatively small.

In one aspect the present invention provides a thin-film crystal wafer having a pn junction characterized in that the pn junction is a heterojunction between a first crystal layer of p GaAs and a second crystal layer of n In$_x$Al$_y$Ga$_{1-x-y}$P that are lattice matched and at the interface of the heterojunction is formed a thin layer of In$_x$Al$_y$Ga$_{1-x-y}$P differing in composition from the n In$_x$Al$_y$Ga$_{1-x-y}$P of the second crystal layer.

In another aspect the present invention provides a method for fabricating a thin-film crystal wafer having a pn junction, for use in fabricating a heterojunction bipolar transistor, by successively overlaying compound semiconductor crystal layers on a GaAs substrate, which method is characterized in comprising the steps of forming a base layer composed of a p GaAs crystal layer, forming thereon a thin film layer of In$_x$Al$_y$Ga$_{1-x-y}$P whose lattice constant differs from the lattice constant of the p GaAs crystal layer, and forming thereon an emitter layer composed of an n $In_xAl_yGa_{1-x-y}P$ whose lattice constant is the same as the lattice constant of the p GaAs crystal layer.

The present invention thus provides a thin-film crystal wafer having a pn junction and a method for fabricating the wafer that overcome the problems of the prior art set out in the foregoing.

This invention will be better understood and other objects and advantages thereof will be more apparent from the following detailed description of preferred embodiments with reference to the accompanying drawings.

DESCRIPTION OF THE PREFERRED EMBODIMENT

Figure 1:
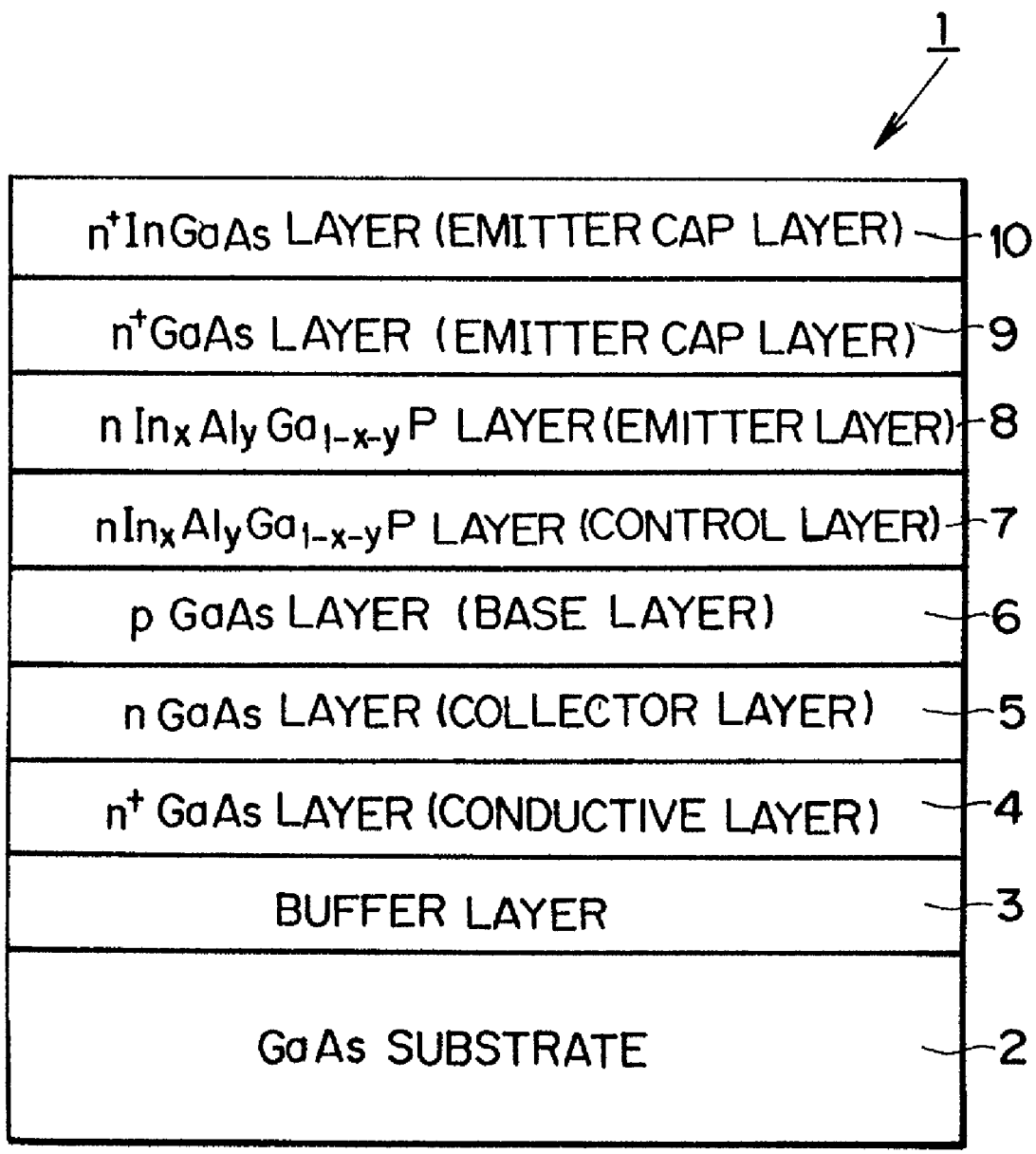
FIG. 1 is a schematic view of a thin-film crystal wafer, for use in fabricating an HBT, that is an embodiment of the present invention.

FIG. 1 is a schematic sectional view of a thin-film crystal wafer having a pn junction that is an embodiment of the present invention. The thin-film crystal wafer 1, which is used to fabricate an HBT, has a multilayer structure consisting of semiconductor thin-film crystal layers successively overlaid on a GaAs substrate 2 composed of semi-insulating GaAs compound semiconductor crystal by the MOCVD method.

Specifically, the thin-film crystal wafer is fabricated in the following manner. On a GaAs substrate 2, the MOCVD method is used first to form a buffer layer 3 and then to form an n$^+$ GaAs layer 4 that acts as a conductive layer, an n GaAs layer 5 that acts as a collector layer, and a p GaAs layer 6 that acts as a base layer, each as thin-film single crystal layer of prescribed thickness. A control layer and an emitter layer are then formed on the p GaAs layer 6 in the order mentioned as thin-film single crystal layers of prescribed thickness, again by the MOCVD method. The layers constituting the control layer and the emitter layer are III-V Group compound semiconductor layers represented by the general formula $In_xAl_yGa_{1-x-y}P$ ($0 \leq x \leq 1$, $0 \leq y \leq 1$, $x+y=1$). Although the case of y=0 in the embodiment of the thin-film crystal wafer having a pn junction is explained here, the present invention also encompasses cases in which y≠0. In FIG. 1, the individual layers are represented by their general formulas. However, the ensuing explanation denotes the composition of the layer 7 as n $In_xGa_{1-x}P$ and the composition of layer 8 as n $In_xGa_{1-x}P$.

In this embodiment, the n $In_xGa_{1-x}P$ layer 7 is formed on the p GaAs layer 6 to act as a control layer for enabling adjustment of the energy band gap at the heterojunction to a desired value and thereby impart design freedom to the thin-film crystal wafer 1, and the n $In_xGa_{1-x}P$ layer 8 is formed on the n $In_xGa_{1-x}P$ layer 7 to act as an emitter layer. An n$^+$ GaAs layer 9 and an n$^+$ InGaAs layer 10 are successively formed on the n $In_xGa_{1-x}P$ layer 8 as semiconductor epitaxial growth layers to act as emitter cap layers.

Thus, in the thin-film crystal wafer 1, the base-emitter junction (pn junction) formed substantially by the p GaAs layer 6 and the n $In_xGa_{1-x}P$ layer 8 is a heterojunction. The x value of the In component of the n $In_xGa_{1-x}P$ layer 8 is set at 0.48 in order to make the lattice constant of the p GaAs layer 6 and the lattice constant of the n $In_xGa_{1-x}P$ layer 8 the same.

The n $In_xGa_{1-x}P$ layer 7 is provided at the interface of the heterojunction formed by the p GaAs layer 6 and the n $In_xGa_{1-x}P$ layer 8 to enable adjustment of the value of the energy band gap at the heterojunction. The n $In_xGa_{1-x}P$ layer 7 is formed as a thin-film layer to be considerably thin in comparison with the p GaAs layer 6 and the n $In_xGa_{1-x}P$ layer 8, and the x value of its In component is set to make the value of the band gap (Eg) fall in the range of 1.75 eV to 2.10 eV. In other words, the p GaAs layer 6 and the n $In_xGa_{1-x}P$ layer 8 are lattice matched but the n $In_xGa_{1-x}P$ layer 7 is not lattice matched with either the p GaAs layer 6 or the n $In_xGa_{1-x}P$ layer 8. The state of the mismatch depends on the x value of the In component of the n $In_xGa_{1-x}P$ layer 7. Specifically, the mismatch increases when x is made either greater or smaller than 0.48.

The mismatched state introduces lattice strain not only into the n $In_xGa_{1-x}P$ layer 7 layer itself but also into the region of the n $In_xGa_{1-x}P$ layer 8 near the side of the n $In_xGa_{1-x}P$ layer 7.

When the x value of the n $In_xGa_{1-x}P$ layer 7 is smaller than 0.48, the energy band gap becomes large to suppress reverse injection of holes and increase the current amplification factor. When the x value of the n $In_xGa_{1-x}P$ layer 7 is greater than 0.48, the energy discontinuity of the conduction band decreases so that the offset voltage decreases relative to that when x=0.48.

From these facts it will be understood that the current amplification factor β of an HBT fabricated from the thin-film crystal wafer 1 can be increased in proportion as the x value of the n $In_xGa_{1-x}P$ layer 7 is decreased and that the offset voltage Vbe can be decreased in proportion as the x value is increased.

The thin-film crystal wafer 1 is structured so that the heterojunction between the lattice-matched p GaAs layer 6 and the n $In_xGa_{1-x}P$ layer 8 (expressed generally as $In_xAl_yGa_{1-x-y}P$ layer 8) is provided at the interface thereof with the n $In_xGa_{1-x}P$ layer 7 (expressed generally as $In_xAl_yGa_{1-x-y}P$ layer 7) that differs in the x value of the In component from the n $In_xGa_{1-x}P$ layer 8 and constitutes a control layer capable of controlling the value of the energy band gap at the heterojunction. Therefore, by varying the value of the energy band gap at the heterojunction while maintaining the lattice constants of the n $In_xGa_{1-x}P$ layer 8 and the p GaAs layer 6 the same, the current amplification factor β of the HBT fabricated using the thin-film crystal wafer 1 can be made large or small and the offset voltage Vbe can be reduced to lower power consumption. In other words, the degree of freedom in designing the HBT is markedly expanded. As the region of lattice constant mismatch produced by the structure is limited, advantages including that warp occurring in the thin-film crystal wafer having a pn junction can be held to a relatively low level and that pattern accuracy is markedly improved during fine patterning can be anticipated, without occurrence of defects that seriously affect the transistor characteristics.

Although the embodiment explained in the foregoing relates to the case where the the y values of the Al components of the emitter layer and the control layer are 0, the same effects as those of the foregoing embodiment can also be obtained when the emitter layer and/or the control layer are formed as thin-film layers of an Al-containing semiconductor system.

The thicknesses of the p GaAs layer 6 constituting the base layer and the n $In_xGa_{1-x}P$ layer 8 constituting the emitter layer can be the same as those ordinarily used in known wafers of this type, and the thickness of the n $In_xGa_{1-x}P$ layer 7 constituting the control layer is made considerably thinner than the thicknesses of the these layers. When the p GaAs layer 6 is formed to a thickness of 800 Å and the n $In_xGa_{1-x}P$ layer 8 to a thickness of 300 Å, for example, the n $In_xGa_{1-x}P$ layer 7 is suitably formed to a thickness of, say, 10-100 Å, but this range is not critical and other thicknesses are also acceptable.

Thin-film crystal wafers of the structure shown in FIG. 1 and having a control layer of 10 Å thickness were fabricated using TMG, TEG, TMA, TMI $AsH_3$ and $PH_3$ as starting materials at a growth temperature of 550° C.-600° C. The measured characteristics of HBTs fabricated from the wafers were as follows:

| | | |
|---|---|---|
| At Eg = 2.10 eV: | β = 120 | Vbe = 1.12 (V) |
| At Eg = 1.90 eV: | β = 114 | Vbe = 1.09 (V) |
| At Eg = 1.75 eV: | β = 112 | Vbe = 1.08 (V) |

The measurements were made using HBTs with 100 μm×100 μm emitters. The value of base current/collector current at a collector current of 1 $kA/cm^2$ was defined as current amplification factor β, and the base-emitter voltage at a collector current of 100 μA under application of a collector voltage of 2 V was defined as offset voltage Vbe.

Figure 2:
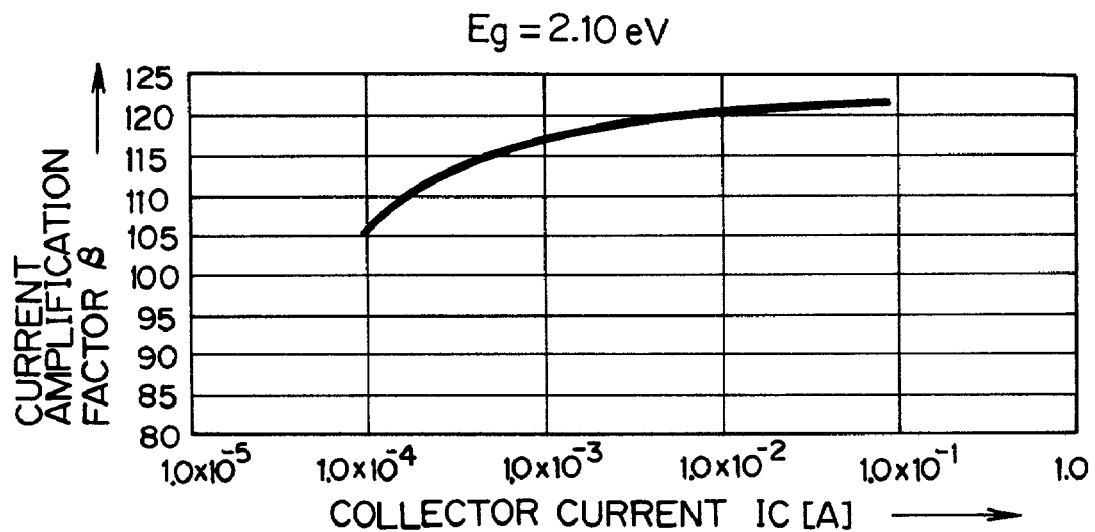
FIG. 2 is a current amplification factor-vs-collector current characteristic curve at a control layer Eg of 2.10 eV.
Figure 3:
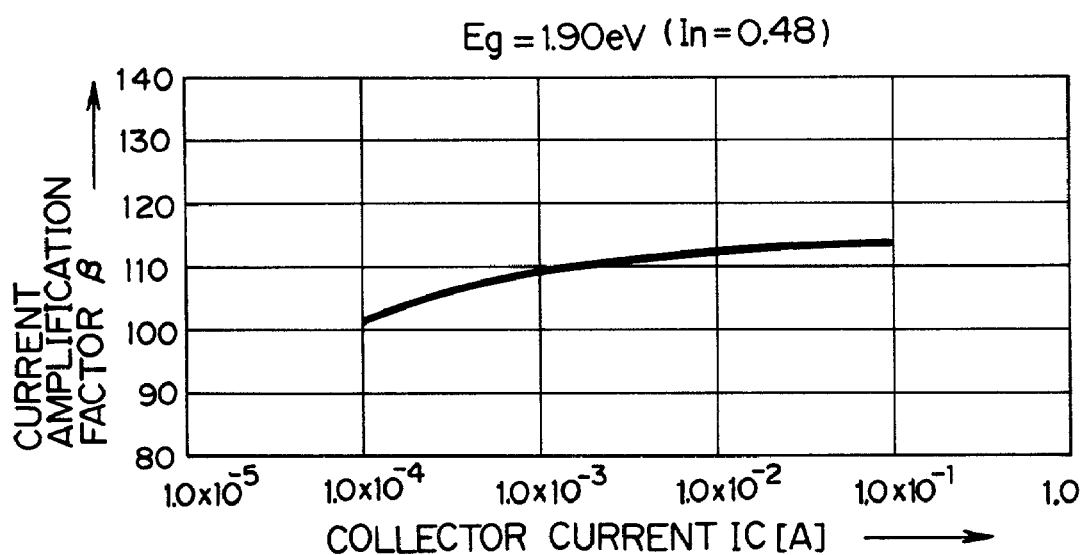
FIG. 3 is a current amplification factor-vs-collector current characteristic curve at a control layer Eg of 1.90 eV.
Figure 4:
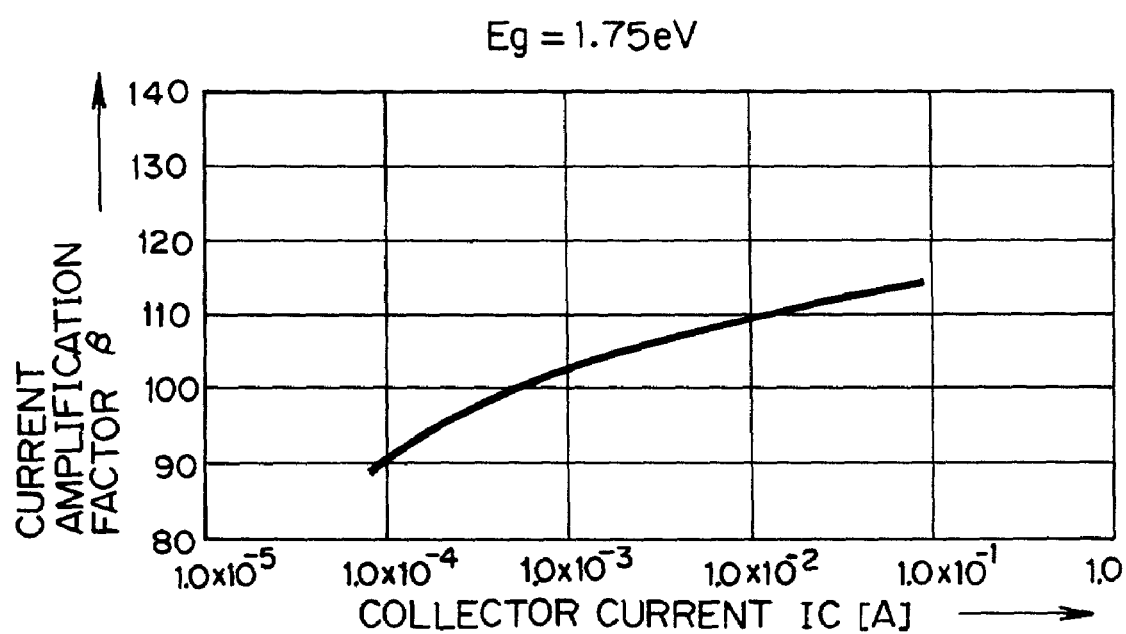
FIG. 4 is a current amplification factor-vs-collector current characteristic curve at a control layer Eg of 1.75 eV.M

FIGS. 2-4 are current amplification factor-vs-collector current characteristic curves obtained at energy band gap values Eg of the n $In_xGa_{1-x}P$ layer 7 of 2.10 eV, 1.90 eV and 1.75 eV As can be seen from these curves, amplification factor β tended to increase with increasing collector current IC. Aside from this general tendency, however, the amplification factor β at all collector current IC levels increased markedly with decreasing x value of the In component of the n $In_xGa_{1-x}P$ layer 7.

As set out in the foregoing, the thin-film crystal wafer 1 is provided at the interface of the heterojunction between the p GaAs layer 6 acting as the base layer and the n $In_xGa_{1-x}P$ layer 8 acting as the emitter layer with the relatively thin n $In_xGa_{1-x}P$ layer 7 acting as the control layer, and the band gap of the n $In_xGa_{1-x}P$ layer 7 is appropriately set in the range of 1.75 eV-2.10 eV As a result, the value of the energy band gap at the heterojunction can be varied to increase or decrease the current amplification factor β and the offset voltage Vbe can be reduced to lower power consumption, while maintaining the lattice constants of the n $In_xGa_{1-x}P$ layer 8 and the p GaAs layer 6 the same. The degree of freedom in designing the HBT is therefore markedly expanded. As the region of lattice constant mismatch produced by the structure is limited, advantages including that overall warp occurring in the thin-film crystal wafer having a pn junction can be held to a relatively low level and that pattern accuracy is markedly improved during fine patterning can be anticipated.

What is claimed is:

1. A thin-film crystal wafer having a pn junction comprising:
    a first crystal layer of p GaAs; and
    a second crystal layer of n $In_xAl_yGa_{1-x-y}P$ (0≦x≦1, 0≦y≦1, x+y=1),
    the first and second crystal layers being lattice-matched layers; wherein
    a thin film layer of $In_xAl_yGa_{1-x-y}P$ (0≦x≦1, 0≦y≦1, x+y=1) differing in composition from the n $In_xAl_yGa_{1-x-y}P$ of the second crystal layer is formed at an interface of the first and second crystal layers.

2. A thin-film crystal wafer having a pn junction as claimed in claim 1, wherein the second crystal layer and the thin-film layer each has a y value of 0.

3. A thin-film crystal wafer having a pn junction as claimed in claim 1, wherein the thin-film has a band gap in the range of 1.75 eV-2.10 eV.

4. A thin-film crystal wafer having a pn junction as claimed in claim 1 or 2, wherein the thin-film layer has a thickness of not less than 10 Å and not greater than 100 Å.

5. A thin-film crystal wafer having a pn junction as claimed in claim 1 or 2 wherein the thin-film layer is formed to be considerably thin in comparison with the first and second crystal layers.

6. A method of fabricating a thin-film crystal wafer having a pn junction, for use in fabricating a heterojunction bipolar transistor, by successively overlaying compound semiconductor crystal layers on a GaAs substrate, the method comprising:
    a step of forming a base layer composed of p GaAs crystal;
    a step of forming on the base layer a thin film layer of $In_xAl_yGa_{1-x-y}P$ (0≦x≦1, 0≦y≦1, x+y=1) whose lattice constant differs from the lattice constant of the p GaAs crystal layer; and
    a step of forming on the thin film layer an emitter layer composed of n $In_xAl_yGa_{1-x-y}P$ (0≦x≦1, 0≦y≦1, x+y=1) crystal whose lattice constant is the same as the lattice constant of the p GaAs crystal layer.

7. A method of fabricating a thin-film crystal wafer having a pn junction as claimed in claim 6, wherein the y value is 0.

8. A method of fabricating a thin-film crystal wafer having a pn junction as claimed in claim 6, wherein the x value of the In component of the emitter layer is 0.48.

9. A method of fabricating a thin-film crystal wafer having a pn junction as claimed in claim 6, wherein the thin-film has a band gap in the range of 1.75 eV-2.10 eV.

10. A method of fabricating a thin-film crystal wafer having a pn junction as claimed in claim 6 or 7, wherein the thin-film layer has a thickness of not less than 10 Å, and not greater than 100 Å.

11. A method of fabricating a thin-film crystal wafer having a pn junction as claimed in claim 6 or 7, wherein the thin-film layer is formed to be considerably thin in comparison with the first and second crystal layers.

* * * * *